United States Patent
Theiler

(10) Patent No.: US 9,894,436 B2
(45) Date of Patent: Feb. 13, 2018

(54) HOST INTERFACE, ACCESSORY INTERFACE AND METHOD FOR MANAGING A CONNECTION BETWEEN A HOST INTERFACE AND AN ACCESSORY DEVICE

(71) Applicant: ams AG, Unterpremstaetten (AT)

(72) Inventor: Helmut Theiler, Lieboch (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/321,716

(22) PCT Filed: Jun. 11, 2015

(86) PCT No.: PCT/EP2015/063094
§ 371 (c)(1),
(2) Date: Dec. 22, 2016

(87) PCT Pub. No.: WO2015/197373
PCT Pub. Date: Dec. 30, 2015

(65) Prior Publication Data
US 2017/0134851 A1    May 11, 2017

(30) Foreign Application Priority Data
Jun. 26, 2014   (EP) .................................... 14174134

(51) Int. Cl.
*H02B 1/00*        (2006.01)
*H04R 3/00*       (2006.01)
(Continued)

(52) U.S. Cl.
CPC ............. *H04R 3/00* (2013.01); *G06F 1/266* (2013.01); *H01R 24/58* (2013.01); *H03F 3/183* (2013.01);
(Continued)

(58) Field of Classification Search
CPC . H04R 5/04; H04R 29/00; H04R 3/00; H04R 2420/01; H04R 2420/05;
(Continued)

(56) References Cited

U.S. PATENT DOCUMENTS 6,633,932 B1 *  10/2003  Bork ....................... G06F 1/266
                                                                    320/107
7,769,187 B1 *   8/2010  Farrar .................. H04R 1/1041
                                                                    381/384
(Continued)

FOREIGN PATENT DOCUMENTS

EP      2654168 A1    10/2013
GB      2502983 A     12/2013
(Continued)

*Primary Examiner* — Leshui Zhang
(74) *Attorney, Agent, or Firm* — McDermott Will & Emery LLP

(57) ABSTRACT

A host interface for a media device comprises a first and a second host audio terminal for receiving a first and a second analog audio signal, a first and a second connector audio terminal for connecting a first and a second pole of a four-pole connector, and a host control circuit. The host control circuit is adapted to detect whether a device requiring a supply signal over the four-pole connector is connected. If no such device is detected, the first and the second analog audio signal are passed to the first and the second connector audio terminal. If such a device is detected, the first connector audio terminal is connected to a supply terminal.

17 Claims, 6 Drawing Sheets

(51) Int. Cl.
| | |
|---|---|
| *G06F 1/26* | (2006.01) |
| *H04R 5/04* | (2006.01) |
| *H04R 29/00* | (2006.01) |
| *H01R 24/58* | (2011.01) |
| *H03F 3/183* | (2006.01) |
| *H03F 3/217* | (2006.01) |
| *H01R 107/00* | (2006.01) |

(52) U.S. Cl.
CPC .............. *H03F 3/217* (2013.01); *H04R 5/04* (2013.01); *H04R 29/00* (2013.01); *H01R 2107/00* (2013.01); *H03F 2200/03* (2013.01); *H04R 2420/01* (2013.01); *H04R 2420/05* (2013.01); *H04R 2420/09* (2013.01)

(58) Field of Classification Search
CPC .. H04R 2420/09; H04R 13/66; H04R 1/1041; H04R 2420/03; H04R 2460/03; H01R 24/58; H01R 2107/00; H01R 27/00; H01R 13/6608; H01R 2201/06; H03F 3/183; H03F 3/217; H03F 2200/03; G06F 1/26; G06F 1/266; G06F 13/385; G06F 13/102; G06F 13/387; G06F 13/4282; G06F 13/4022; G06F 13/4068; G06F 13/10; G06F 13/122; G06F 13/20; G06F 11/3051; G06F 11/3041; G06F 11/2289; G06F 11/3055; G06F 11/3065; G06F 11/3089; G06F 11/3485; G06F 9/4411; G06F 9/44505; G06F 9/4413; G06F 9/4418; G06F 2213/0042; G11B 31/00; G11B 33/00; H04M 1/02; H04M 1/215; H04M 1/60; H04M 1/725; H04M 1/6058; H04M 1/6083; H04M 1/72527; H04B 1/3877; H04W 4/005; H04W 76/023; H04W 12/06; H04L 41/0809; H04L 63/0876; Y02B 60/01

USPC ..... 381/74, 77, 78, 79, 80, 81, 85, 334, 111, 381/123, 302, 86, 314, 315, 58; 455/557–559, 418–420, 90.1, 90.2, 569.2, 455/68, 99, 88; 710/8, 10, 11, 12, 14–19; 700/94; 439/46, 49

See application file for complete search history.

(56) References Cited

U.S. PATENT DOCUMENTS

| | | | | |
|---|---|---|---|---|
| 8,290,171 B1* | 10/2012 | Helfrich | ............... | H04R 5/04 381/111 |
| 8,829,932 B2* | 9/2014 | Turner | ............... | G01R 31/2844 324/750.3 |
| 8,831,234 B2* | 9/2014 | Turner | ............... | H03K 5/1254 381/58 |
| 9,313,595 B1* | 4/2016 | Jain | ............... | H04R 29/00 |
| 9,609,425 B2* | 3/2017 | Mackay | ............... | H04R 1/1091 |
| 2003/0142817 A1* | 7/2003 | Liao | ............... | H02J 7/0054 379/428.01 |
| 2003/0211869 A1* | 11/2003 | Lee | ............... | H04M 1/725 455/572 |
| 2004/0025062 A1* | 2/2004 | Sugiura | ............... | G06F 1/26 713/300 |
| 2004/0229648 A1* | 11/2004 | Yamamoto | ............... | H04M 1/0254 455/557 |
| 2005/0141208 A1* | 6/2005 | Niinuma | ............... | G06F 1/263 361/797 |
| 2007/0098184 A1* | 5/2007 | Ibe | ............... | H04R 5/04 381/77 |
| 2007/0281756 A1* | 12/2007 | Hyatt | ............... | H02J 7/0042 455/573 |
| 2008/0044004 A1* | 2/2008 | Keehr | ............... | H04M 1/6058 379/431 |
| 2008/0164994 A1* | 7/2008 | Johnson | ............... | H01R 13/703 340/533 |
| 2008/0242147 A1* | 10/2008 | Warkrat | ............... | H01R 23/6873 439/607.01 |
| 2008/0280561 A1* | 11/2008 | Lin | ............... | H04M 1/05 455/41.2 |
| 2009/0058183 A1* | 3/2009 | Morris | ............... | H02J 1/10 307/23 |
| 2009/0179768 A1* | 7/2009 | Sander | ............... | H04M 1/05 340/13.27 |
| 2009/0191914 A1* | 7/2009 | Stahl | ............... | H04M 1/72527 455/557 |
| 2009/0251003 A1* | 10/2009 | Umemura | ............... | H02J 1/10 307/31 |
| 2010/0004857 A1* | 1/2010 | Pereira | ............... | G01C 21/00 701/533 |
| 2010/0075723 A1* | 3/2010 | Min | ............... | H01R 24/58 455/569.1 |
| 2010/0156343 A1* | 6/2010 | Jung | ............... | H02J 7/025 320/108 |
| 2010/0215183 A1* | 8/2010 | Hansson | ............... | H04R 1/1033 381/58 |
| 2010/0284525 A1* | 11/2010 | Sander | ............... | H04R 1/1091 379/93.06 |
| 2011/0116751 A1* | 5/2011 | Terlizzi | ............... | G02B 6/3817 385/88 |
| 2011/0320837 A1 | 12/2011 | Suematsu | | |
| 2012/0257768 A1* | 10/2012 | Park | ............... | H04M 1/6058 381/94.5 |
| 2013/0020882 A1* | 1/2013 | Prentice | ............... | H04R 29/004 307/116 |
| 2013/0158919 A1* | 6/2013 | Shah | ............... | H04R 5/04 702/64 |
| 2014/0003616 A1* | 1/2014 | Johnson | ............... | H04R 29/001 381/74 |
| 2014/0073250 A1* | 3/2014 | Singh | ............... | H04M 1/0258 455/41.2 |
| 2014/0195826 A1* | 7/2014 | Wojcik | ............... | H05K 5/0086 713/300 |
| 2014/0205109 A1* | 7/2014 | Theiler | ............... | H04R 1/1083 381/74 |
| 2015/0326970 A1* | 11/2015 | Miske | ............... | H04R 1/1041 381/123 |
| 2015/0358719 A1* | 12/2015 | Mackay | ............... | G06F 11/3051 381/384 |
| 2016/0094906 A1* | 3/2016 | Keskin | ............... | H04R 1/1041 381/74 |
| 2016/0127815 A1* | 5/2016 | Ookuri | ............... | H04R 1/06 381/119 |

FOREIGN PATENT DOCUMENTS

| | | |
|---|---|---|
| WO | 2012171690 A1 | 12/2012 |
| WO | 2014170181 A1 | 10/2014 |

* cited by examiner

HOST INTERFACE, ACCESSORY INTERFACE AND METHOD FOR MANAGING A CONNECTION BETWEEN A HOST INTERFACE AND AN ACCESSORY DEVICE

BACKGROUND OF THE INVENTION

The invention relates to a host interface for a media device, to an accessory interface for a headphone that can be used with such a host interface, and to a method for managing a connection between a host interface for a media device and an accessory interface.

In conventional media devices, like mobile phones, tablet computers or media players, usually a three-pole or four-pole connector is used for connecting a headphone. Two poles of the connector are used for transmitting a stereo analog audio signal from the media device to the headphone. A third pole is often used to transmit microphone signals from a microphone included in the headphone to the media device. A fourth pole is used for transmitting a ground potential.

Besides a wired headphone, other kinds of accessories are desired to be connected to the media device. In conventional implementations, dedicated interfaces with separate connectors for connecting the accessory to the media device may be used. However, additional connectors need space, which is limited in modern media devices.

SUMMARY OF THE INVENTION

The present disclosure provides an improved interface concept for connecting a media device that allows easier connections between the media device and accessories.

The improved interface concept is based on the idea that for a media device with a four-pole connector the first and the second pole, normally used for transmitting analog audio signals, may alternatively be used for transmitting one or more supply signals depending on the requirements of a connected accessory. Hence, if a conventional audio headset, with or without a microphone, is connected to the media device, it receives the analog audio signals as usual. If a special accessory requiring a supply signal is connected, one or both of the audio poles of the four-pole connector are used for transmitting the required supply signals.

The decision regarding which kind of accessory is connected may be made based on an identification of the connected accessory. In this respect the term "accessory" comprises both conventional headphones and special devices such as sensors or the like, which may also transmit sensor data to the media device over the four-pole connector, in particular over the third pole or microphone pole of the four-pole connector.

A special accessory may also be able to process both audio signals and use the supply signal, but not concurrently.

The described functions may be implemented by respective interfaces, in particular by a host interface for a media device and by an accessory interface for an accessory device, in particular a headphone or a hands-free set.

Accordingly, with the improved interface concept, connection of various devices to a media device is simplified and particularly can be done with a single connector.

Such a four-pole connector may be a tip-ring-ring-sleeve, TRRS, connector, commonly also known as a 3.5 mm jack. Standard definitions of such connectors are given, for example, in EIA RS-453, or IEC 6063-11. Of course, other sizes of such a connector, like a 2.5 mm jack, may be used.

An exemplary embodiment of a host interface for a media device according to the improved concept comprises a first host audio terminal for receiving a first analog audio signal, a second host audio terminal for receiving a second analog audio signal, a first connector audio terminal for connecting a first pole of the four-pole connector, and a second connector audio terminal for connecting a second pole of the four-pole connector. The host interface further includes a host control circuit that is adapted to detect whether a device is connected that requires a supply signal over the four-pole connector. If no device requiring the supply signal is detected, for example a conventional headphone, the host control circuit effects that the first analog audio signal is passed to the first connector audio terminal and the second analog audio signal is passed to the second connector audio terminal. If a device requiring the supply signal is detected, the host control circuit effects that the first connector audio terminal is connected to a supply terminal.

The host control circuit is further adapted to detect whether a device is connected that requires the supply signal and further requires a further supply signal over the four-pole connector. If such a device further requiring the further supply signal is detected, the host control circuit assures that the second connector audio terminal is connected to a further supply terminal.

In various implementations, the supply terminal, respectively the further supply terminal, is operable to be connected to one of the following: a supply rail of the host interface, a voltage regulator of the host interface, a current regulator of the host interface, a supply rail of the media device comprising the host interface, a voltage regulator of the media device, a current regulator of the media device. The further supply terminal may further be connectable to a power ground terminal being a reference potential terminal for the supply terminal being connected to the first connector audio terminal.

In some implementations the host control circuit is adapted, if a device requiring the supply signal is detected, to generate a deactivation signal for deactivating respective audio amplifiers providing the first and the second analog audio signals. For example, an output stage of the amplifiers can be deactivated by such a deactivation signal, such that a physical electrical connection between the host audio terminals and the connector audio terminals may be maintained without any influence on the signal at the respective terminals.

However, in addition or as an alternative, the host control circuit may be adapted, if a device requiring the supply signal is detected, to electrically disconnect the first connector audio terminal from the first host audio terminal and the second connector audio terminal from the second host audio terminal.

In various implementations the host interface further comprises a connector microphone terminal for connecting a third pole of the four-pole connector.

In some embodiments, the host control circuit is adapted to detect whether a device requiring the supply signal is connected based on an identification signal received at the connector microphone terminal. Such an identification signal may be an encoded digital sequence sent by the connected device, a signal sent from the connected device with a distinct frequency spectrum or with a special signal form. However, other implementations of an identification signal are also possible.

In some implementations a host interface according to the improved interface concept further comprises a host microphone terminal and a data receiver. In such an implementation the host control circuit may be adapted to detect whether a device is connected that transmits encoded data over the connector microphone terminal. If a device transmitting encoded data is detected, the host control circuit effects that the connector microphone terminal is connected to the data receiver for decoding received encoded data. If no device-transmitting encoded data is detected, the host control circuit effects that the connector microphone terminal is connected to the host microphone terminal. Accordingly, in the first case, the decoded data may be provided to the media device, for example as a digital bit stream or another appropriate representation of the received data. In the second case, an analog microphone signal generated, for example, by a microphone of a connected headset.

The host interface may be configured to transmit various signals over the connector microphone terminal. For example a current signal or a voltage signal may be generated by the host interface. This signal can be used at the accessory side for generating a supply signal, e.g. for electronic parts in the accessory. However, such supply signal has less power capability than the supply signals provided over the first and the second connector audio terminals. Clock information may be transmitted in encoded form over the connector microphone terminal, for example by various kinds of pulses that can be used directly or as a synchronization for a clock generator on the accessory side. A host identification signal may be sent over the connector microphone terminal that can be evaluated by the accessory side to potentially identify which kid of host the accessory is connected to.

In some implementations the host interface may further comprise a data transmitter that is configured to send an encoded digital signal, in particular an audio signal to connect a microphone terminal. The transmission may, for example, be done according to the I2S standard.

An embodiment of an accessory interface according to the improved interface concept for a headphone or a hands-free kit comprises a first accessory audio terminal for connecting a first pole of the four-pole connector, a second accessory audio terminal for connecting a second pole of the four-pole connector, an accessory microphone terminal for connecting a third pole of the four-pole connector, a first accessory loudspeaker terminal for connecting a first loudspeaker and a second accessory loudspeaker terminal for connecting a second loudspeaker. The accessory interface further includes a class-D amplifier with a first and a second amplifier output and an accessory data receiver adapted to receive an encoded digital audio signal from the accessory microphone terminal for producing the digital audio data for the class-D amplifier. An accessory control circuit of the accessory interface is adapted to detect which kind of media device is connected at the four-pole connector.

The headphone can also be a headset in some applications.

A class-D amplifier, which is also known as a switching amplifier, is an electronic amplifier where all power devices, usually MOSFETS, are operated as binary switches. During operation these switches are either fully on or fully off. The digital input signal of the class-D amplifier may be a variable duty cycle square wave of which the low frequency portion of the spectrum is essentially the wanted output signal, and of which the high frequency portions serves the purpose of making the wave form binary so it can be amplified by switching the power devices. A passive low pass filter usually removes the unwanted high frequency components, i.e. smoothes the pulses out and recovers the desired low frequency signal. In conventional class-D amplifiers, to maintain high efficiency, the filter may be made with purely reactive components, which store the excess energy until it is needed instead of converting some of it into heat. Hence, the class-D amplifier can be operated with less power.

For example, the accessory control circuit is adapted to detect whether a media device is connected at the four-pole connector having a host interface according to the embodiments described above with a data transmitter that is configured to send an encoded digital audio signal to the connector microphone terminal. If no such media device is detected, the accessory control circuit effects that the first accessory audio terminal is connected to the first accessory loudspeaker terminal and the second accessory audio terminal is connected to the second accessory loudspeaker terminal. Hence, a conventional analog stereo signal can be transmitted and played by respective loudspeakers connected to the accessory loudspeaker terminals.

However, if such a media device with the defined host interface is detected, the accessory control circuit effects that supply inputs of the class-D amplifier are connected to the first and second accessory audio terminals, which in this case receive a supply signal from the host interface of the media device. Furthermore, the digital audio data provided by the accessory data receiver are passed to the class-D amplifier, and the first amplifier output is connected to the first accessory loudspeaker terminal and the second amplifier output is connected to the second accessory loudspeaker terminal. Accordingly, the digital audio signal is converted to respective loudspeaker signals by the class-D amplifier and played by respective loudspeakers connected to the accessory loudspeaker terminals.

Hence, a headphone or a hands-free kit equipped with such an accessory interface is able to work both with conventional media devices and media devices which are equipped with the host interface according to the improved interface concept. This has the further advantage that class-D amplifiers with a high power efficiency can still be used despite a cable length between the media device and the accessory interface, as the audio data are sent in a digital format to the accessory interface and signal lines between the class-D amplifier and the loudspeakers can be kept short. This prevents or at least reduces potential electromagnetic interface, EMI, problems.

In some applications, the headset or the hands-free kit may include one or more microphones. For such applications the accessory interface may further comprise an accessory data transmitter adapted to receive a microphone signal from a microphone of the headset or the hands-free kit and to produce an encoded digital microphone signal thereof. In such an implementation the accessory control circuit is adapted to detect whether a media device is connected that is operable to process an encoded digital microphone signal. If such a media device is detected, the accessory control circuit effects that the encoded digital microphone signal is sent to the accessory microphone terminal. The encoded digital microphone signal may also include microphone data from more than one microphone, i.e. a multiplexed microphone signal. Such multiplexing is e.g. disclosed in the international patent application publication WO 2012/171690 A1 of the ams AG, which is incorporated herein by reference in its entirety.

If no such media device is detected, the accessory control circuit effects that an analog microphone signal is sent to the accessory microphone terminal. Accordingly, the microphone signal can be transmitted over the microphone terminal in an appropriate format, depending on the ability of the connected host interface to process analog or digital microphone signals. The decision of which format to choose may be made on a host identification signal sent from the host interface.

In an embodiment of a method for managing a connection between a host interface for a media device and an accessory device, the host interface and the accessory device are physically connected by means of a four-pole connector, as described above in conjunction with the host interface and the accessory interface. In the host interface it is detected whether an accessory device is connected that requires a supply signal over the four-pole connector and further requires a further supply signal over the four-pole connector. If no accessory device requiring these supply signals is detected, the host interface passes a first analog audio signal to a first pole of the four-pole connector and passes a second analog audio signal to a second pole of the four-pole connector. If an accessory device requiring the supply signal and the further supply signal is detected, the host interface connects the first pole to a supply terminal and connects the second pole of the four-pole connector to a further supply terminal. Such supply terminals may be included in the host interface or in the media device. Reference is made to the description of the host interface above.

The detection of whether an accessory device requiring the supply signal and the further supply signal is connected may be based on an identification signal received at a third pole of the four-pole connector. Such a third pole may be a microphone terminal of the four-pole connector.

In some implementations, the host interface detects whether an accessory device is connect that transmits encoded data over the third pole of the four-pole connector. If such an accessory device transmitting encoded data is detected, received encoded data are passed in a host interface to a data receiver of the host interface for decoding the received encoded data. If no device transmitting encoded data is detected, the third pole is connected in the host interface to a host microphone terminal of the host interface.

Further embodiments of the method become easily apparent from the various implementations described in conjunction with the host interface and the accessory interface according to the improved interface concept. This inter alia refers to the implementation of the accessory device as a headphone comprising a class-D amplifier as described above.

BRIEF DESCRIPTION OF THE DRAWINGS

The following drawings and figures of exemplary embodiments may further illustrate and explain the improved interface concept. Devices and circuit blocks with the same structure and the same effect, respectively, are denoted with the same reference signs. In so far as circuit blocks or devices correspond to one another in terms of their function in different figures, the device thereof is not repeated for each of the following figures.

In the drawings.

DETAILED DESCRIPTION

Figure 1:
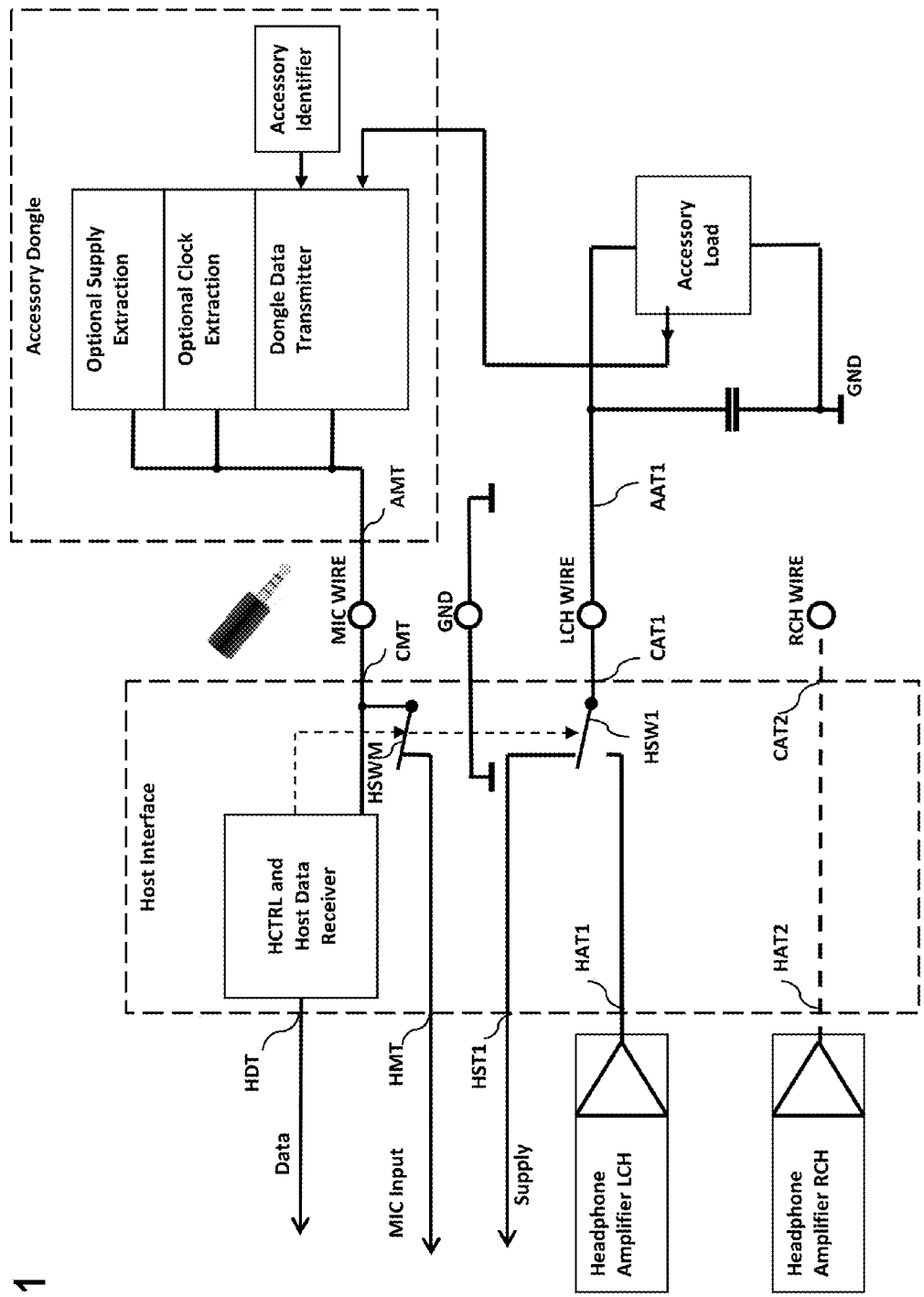
FIG. 1 shows an embodiment of a host interface in conjunction with an accessory interface.

FIG. 1 shows an example implementation, respectively application, of the improved interface concept. A host interface to be used with or within a media device is connected to an accessory device with an accessory dongle and an accessory load. The physical connection between the host interface and the accessory device is made over a four-wire connection being implemented with a four-pole connector. Such a four-pole connector may be implemented with a standard 3.5 mm plug, also known as a TRRS jack. Preferably, the host interface is connected to a respective socket and the accessory device has a cable with the appropriate plug, which is depicted as an example. Other kinds of four-pole connectors may still be used. A first and a second pole of the four-pole connector may be connected to a left channel wire and a right channel wire LCH WIRE, RCH WIRE, which are usually used for transmitting analog audio signals, in particular a stereo audio signal. A third pole is connected to a respective microphone wire, MIC WIRE, and a fourth pole serves to establish a common ground connection GND.

To this end the host interface comprises a connector microphone terminal CMT connected to the third pole, respectively the MIC WIRE, and a first and a second connector audio terminal CAT1, CAT2 connected to the LCH WIRE, RCH WIRE, respectively. The fourth pole GND may be connected to a ground terminal of the host interface or of the media device itself.

The host interface further comprises a host control circuit HCTRL and a host data receiver being coupled to the connector microphone terminal CMT. The host control circuit HCTRL and the host data receiver are further coupled to a host data terminal HDT for transmitting data to the media device. A host microphone terminal HMT is switchably coupled to the connector microphone terminal CMT and designed for being connected to a microphone input of the media device. The host interface further comprises a first and a second host audio terminal HAT1, HAT2, which are designed to receive a first and a second analog audio signal, for example from respective headphone amplifiers of the media device. The first and the second host audio terminal HAT1, HAT2 are coupled to the first and the second connector audio terminal CAT1, CAT2. Furthermore, the first connector audio terminal CAT1 is switchably coupled to a host supply terminal HST1.

In one application configuration a conventional headphone with or without a microphone may be connected to the four-pole connector. In this case the host control circuit HCTRL effects that the first and the second audio signal received at the first and the second host audio terminal HAT1, HAT2 are passed to the respective connector audio terminals CAT1, CAT2. This may be done by respective switching of a host switch HSW1 under control of the host control circuit HCTRL. Additionally, the connection of the connector microphone terminal CMT can be controlled depending on the type of signal going over that terminal CMT.

For example, if a device with a conventional analog microphone is connected, the analog microphone signal is passed to the host microphone terminal HMT. If, however, an encoded digital signal is received at the connector microphone terminal CMT, this signal is passed to the host data receiver for decoding and further processing. This switching function is symbolized by the switch HSWM. For example, the switch HSWM has a default setting connecting the connector microphone terminal CMT to the host microphone terminal HMT.

In another application feasible with the host interface according to the improved interface concept, an accessory device is connected to the four-pole connector that is not designed for processing or playing analog audio signals. Instead, the accessory includes some kind of load, for example, a sensor, that requires a supply signal for being operated. To this end, the accessory load is connected to an accessory audio terminal AAT1. An output signal of the accessory load is provided to a dongle data transmitter of the accessory dongle that processes the output signal and provides an encoded version of the processed signal to an accessory microphone terminal AMT connected to the third pole MIC WIRE of the four-pole connector. A data transmission may be performed as described in international patent application PCT/EP2014/057175 of the ams AG dealing with bidirectional data communication over a single wire, which is incorporated herein by reference in its entirety. Accordingly, the accessory dongle may optionally include a supply extraction which generates a supply voltage or a supply current for the accessory dongle from a signal on the MIC WIRE. Furthermore, a clock extraction may be optionally included in the accessory dongle, which generates a clock signal, e.g. for transmission timing and/or analog-to-digital conversion. For example, the clock may be extracted from short pulses or peak signals received over the MIC WIRE.

In the configuration shown in FIG. 1, data received from the accessory, respectively the accessory load, via the dongle data transmitter, are processed in the host data receiver by respective passing of the signal to the host data receiver and/or a respective switching setting of the switch HSWM.

A stabilizing or smoothing capacitor may be optionally connected in parallel to supply terminals of the accessory loads, i.e. between the accessory audio terminal AAT1 and the ground terminal GND.

In order to be able to work both with conventional headsets and accessories requiring a supply signal, the host control circuit HCTRL is adapted to detect whether a device requiring a supply signal over the four-pole connector is connected. For example, this detection may be based on an identification signal received from the connected device, indicating the type of accessory. For example, the identification signal may be in the form of a digital identifier naming the type and/or requirements of the accessory. However, the identification signal may be formed by a signal having a predefined signal form and/or a predefined frequency spectrum that can be interpreted by the host control circuit HCTRL. The identification signal can also be a predefined signal sequence or the like.

If a device requiring the supply signal is detected, the first connector audio terminal CAT1 is connected to the supply terminal HST1, as depicted in FIG. 1. If no device requiring the supply signal is detected, for example because no identification signal is received, such as from a conventional headphone, the host control circuit HCTRL is configured to pass the audio signals from the host audio terminal HAT1, HAT2 to the connector audio terminals CAT1, CAT2. For example, the switch HSW1 has a default setting connecting the first host audio terminal HAT1 to the first connector audio terminal CAT1.

With the host interface according to the improved interface concept, a media device can use a single connector socket more flexibly compared to conventional solutions. Not only conventional headphones with or without microphones can be connected, but other kinds of accessory devices like sensors or other data-collecting can be connected.

Figure 2:
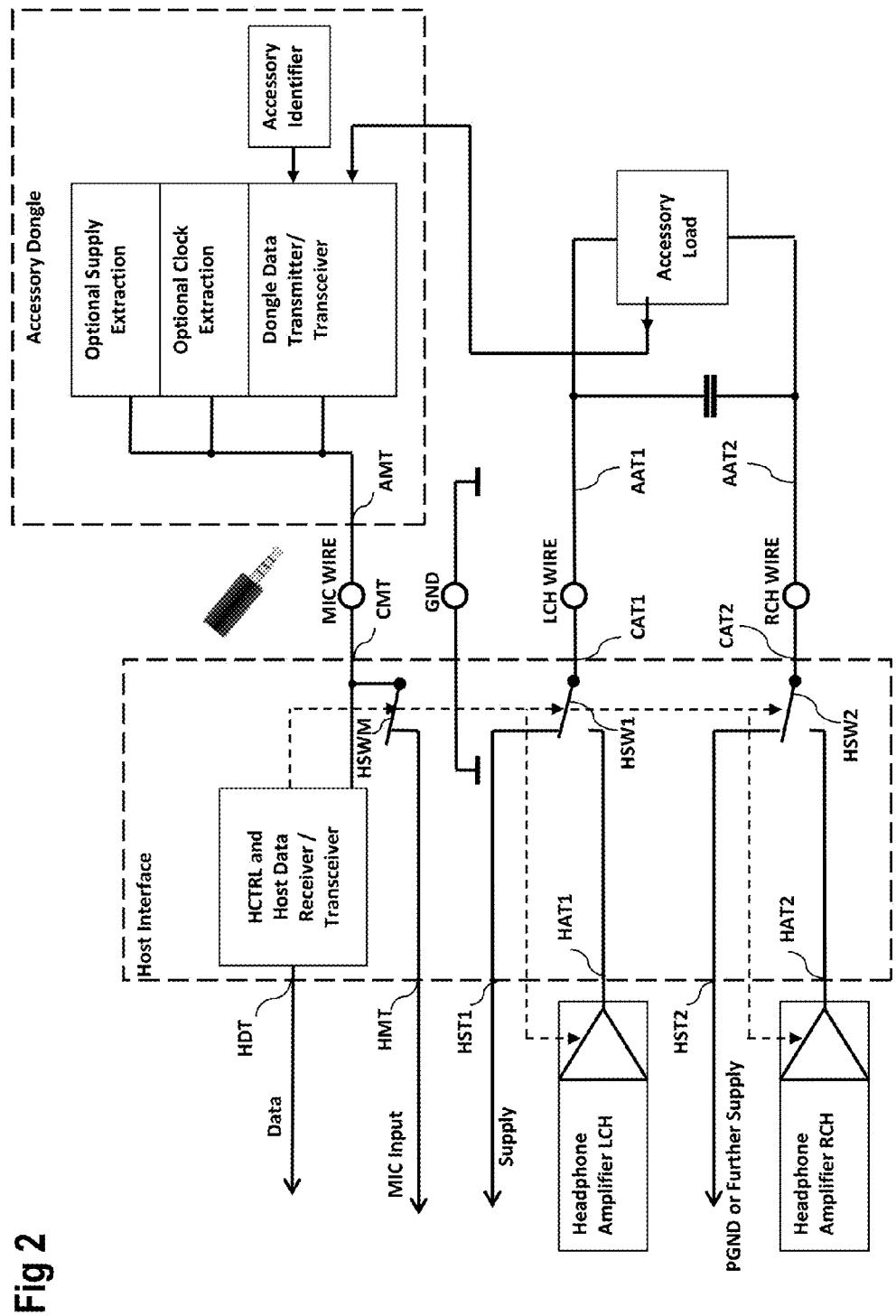
FIG. 2 shows a further embodiment of a host interface in conjunction with an accessory interface.

FIG. 2 shows a further embodiment with a host interface and an accessory connected thereto, this embodiment being based on the one shown in FIG. 1. Therefore, only the differences to FIG. 1 will be discussed in more detail. The host interface of FIG. 2 is further adapted, not only to provide a single supply signal at the connector audio terminal CAT1, but also a further supply signal at the second connector audio terminal CAT2. This can be used by a connected accessory having a second accessory audio terminal AAT2 connected to the second pole RCH WIRE of the four-pole connector. To this end the host interface comprises a further supply terminal HST2, which may be used for providing a further supply signal or a dedicated reference potential or ground potential, e.g. a power ground PGND. Accordingly, a further switch HSW2 is symbolized, indicating that either the second host audio terminal HAT2 or the further supply terminal HST2 is actively connected to the second connector audio terminal CAT2. For example, the switch HSW2 has a default setting connecting the second host audio terminal HAT2 to the second connector audio terminal CAT2.

Figure 6:
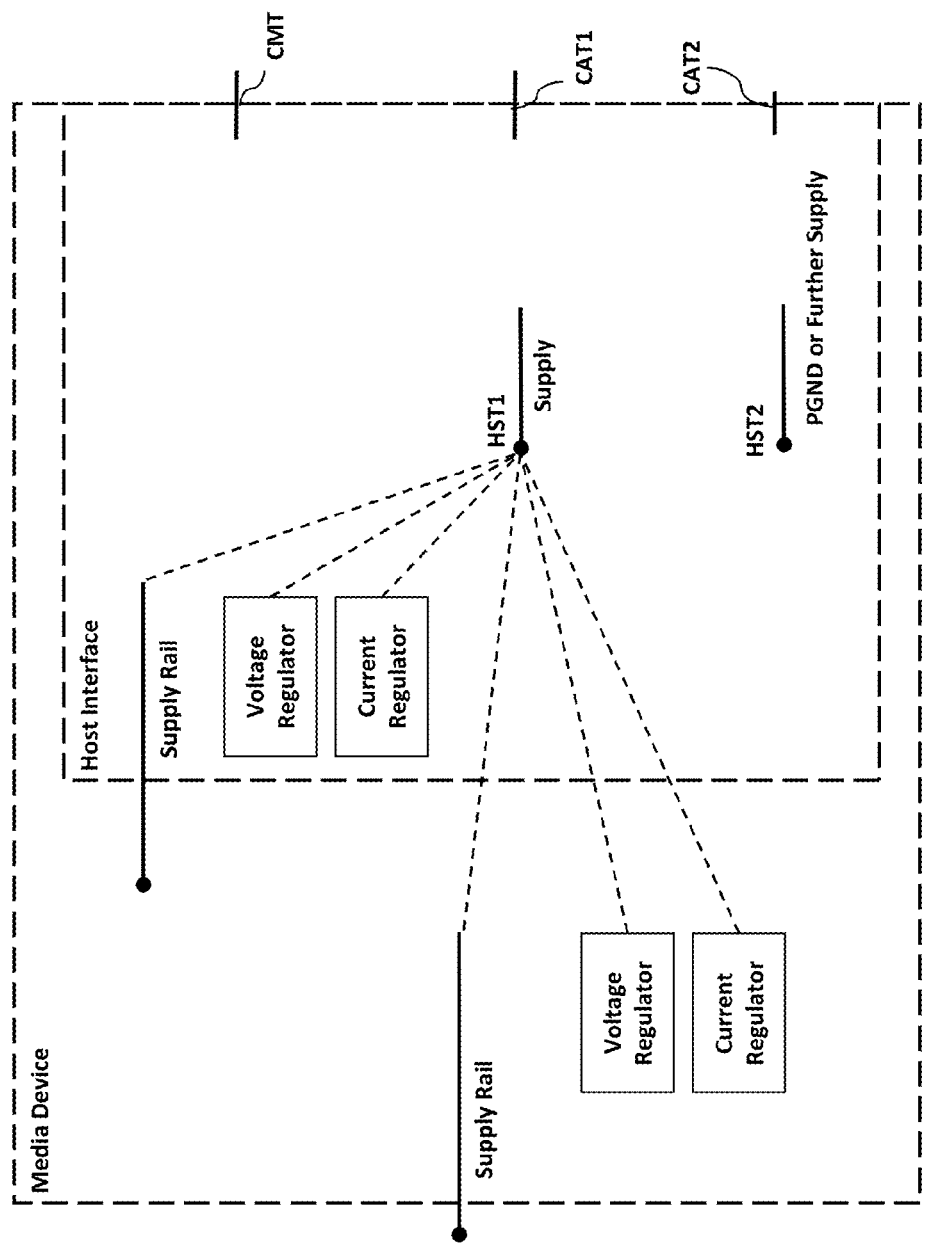
FIG. 6 shows an example block diagram of a media device with a host interface.

In such implementations the host control circuit HCTRL is configured to detect whether a device is connected that requires the supply signal and further requires a further supply signal over the four-pole connector. The detection may be performed in the same way as described above for FIG. 1. The supply terminal HST1 and the further supply terminal HST2 may be connected to a supply rail of the host interface or of the media device comprising the host interface. Furthermore, the supply signal and/or the further supply signal may be provided by a voltage regulator or a current regulator of either the host interface or the media device comprising the host interface. Respective options for such connections are shown as examples in FIG. 6. The additional ground terminal PGND shown in FIG. 2 may be a dedicated reference potential terminal being separated from the conventional ground terminal GND in so far as potential distortions in the feedback of the accessory load are prevented from having influence on the conventional ground potential. Hence, the overall signal quality in the system may be improved.

In some implementations, the supply signal and the further supply signal being provided to the connector audio terminals CAT1, CAT2 may be one positive and one negative voltage with reference to the potential at the ground terminal GND.

It should be noted that a supply signal generated from the connector microphone terminal CMT has less power capability than the supply signals provided over the first and the second connector audio terminals CAT1, CAT2.

The symbolic switch HSW1 of FIG. 1 and FIG. 2 and the symbolic switch HSW2 of FIG. 2 may be implemented as low impedance switches, both from the connector audio terminals CAT1, CAT2 to the host supply terminals HST1, HST2 and to the host audio terminals HAT1, HAT2, for example realized by transistor switches. Hence, if a device requiring the supply signal and/or the further supply signal is detected, the first connector audio terminal CAT1 is electrically disconnected from the first host audio terminal HAT1, and the second connector audio terminal CAT2 is electrically disconnected from the second host audio terminal HAT2.

However, in some implementations, if a device requiring the supply signal is detected the host control circuit HCTRL may be adapted to generate a deactivation signal for deactivating respective audio amplifiers providing the first and the second analog audio signals, for example the headphone amplifiers shown in FIG. 1 and FIG. 2. For example, the output stage of the respective amplifiers may be deactivated in the amplifiers such that even if an electrical connection between the host audio terminals HAT1, HAT2 and the supply terminals HST1, HST2 is present, there is no current flowing to the amplifier output terminal. Hence, an adverse feedback onto the amplifiers can be avoided. For example, respective optional control lines for providing the deactivation signal to the headphone amplifiers are shown in FIG. 2.

A further, optional difference to the implementation of FIG. 1 is given in that the host data receiver may also be implemented as a transceiver being able to transmit data over the third pole MIC WIRE. In this case, it is expedient that the dongle data transmitter is also implemented as a transceiver being able to additionally receive data from the host data transceiver.

The parameters of the accessory may be stored in an accessory identifier and retrieved from the dongle data transmitter for transmitting the identification signal to the host interface. This may be done in response to an identification request of the host interface or in an initialization phase after a connection to the host interface has been detected by the accessory dongle. Such implementation may also be used with the arrangement shown in FIG. 1.

Figure 3:
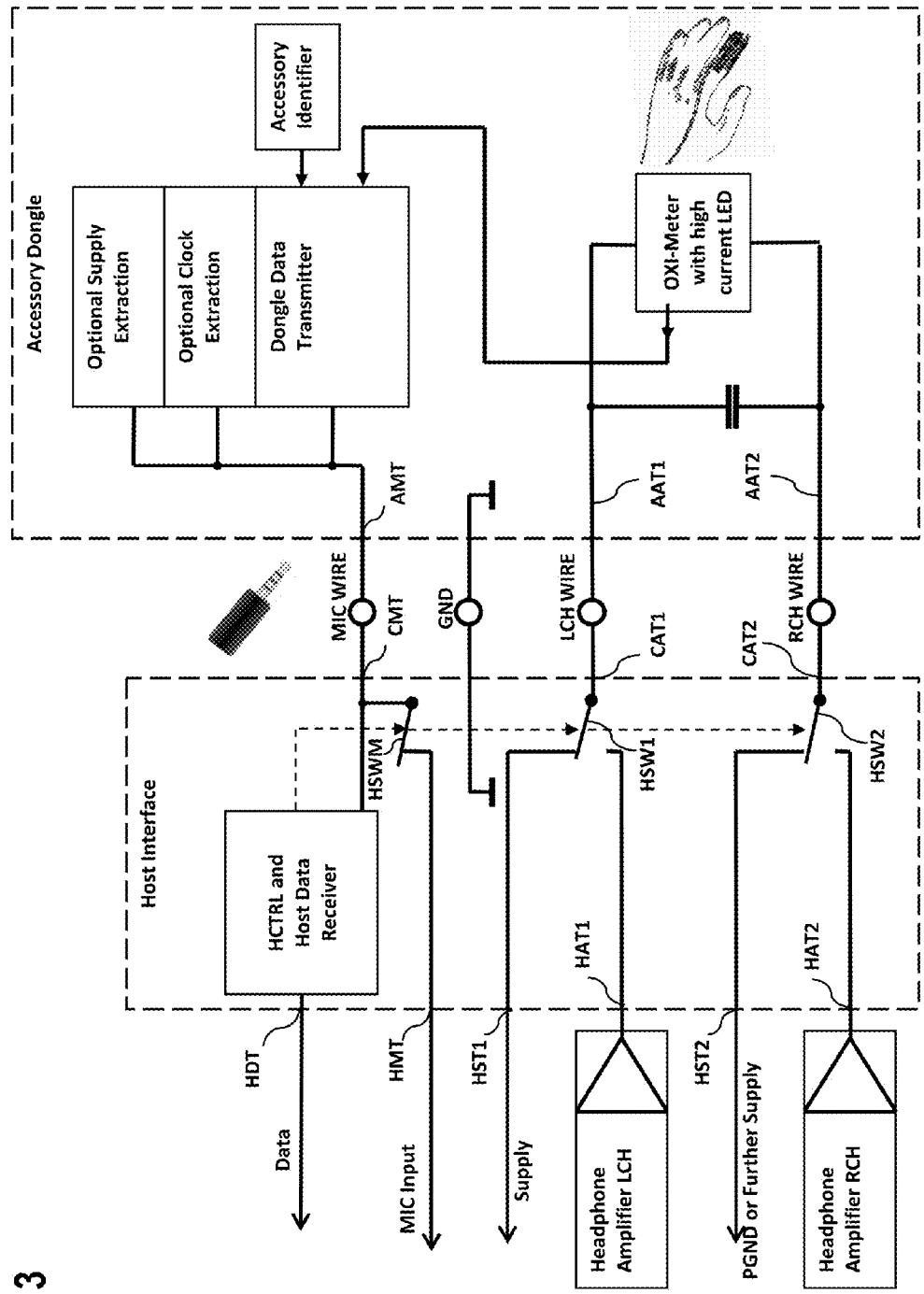
FIG. 3 shows an example application of the arrangement of FIG. 2.

FIG. 3 shows a first example application of the arrangement shown in FIG. 2. In particular, the accessory load comprises an oximeter with a high current LED, i.e. a sensor device for measuring the oxygen saturation and/or the heart rate of a person. To this end, for example a finger of the person is lit with the high current LED, and the resulting light is measured with a photodetector. The respective output signal is transmitted to the host interface via the dongle data transmitter as described above. Such an application requires about 100 mA to 200 mA for driving the LED.

Figure 4:
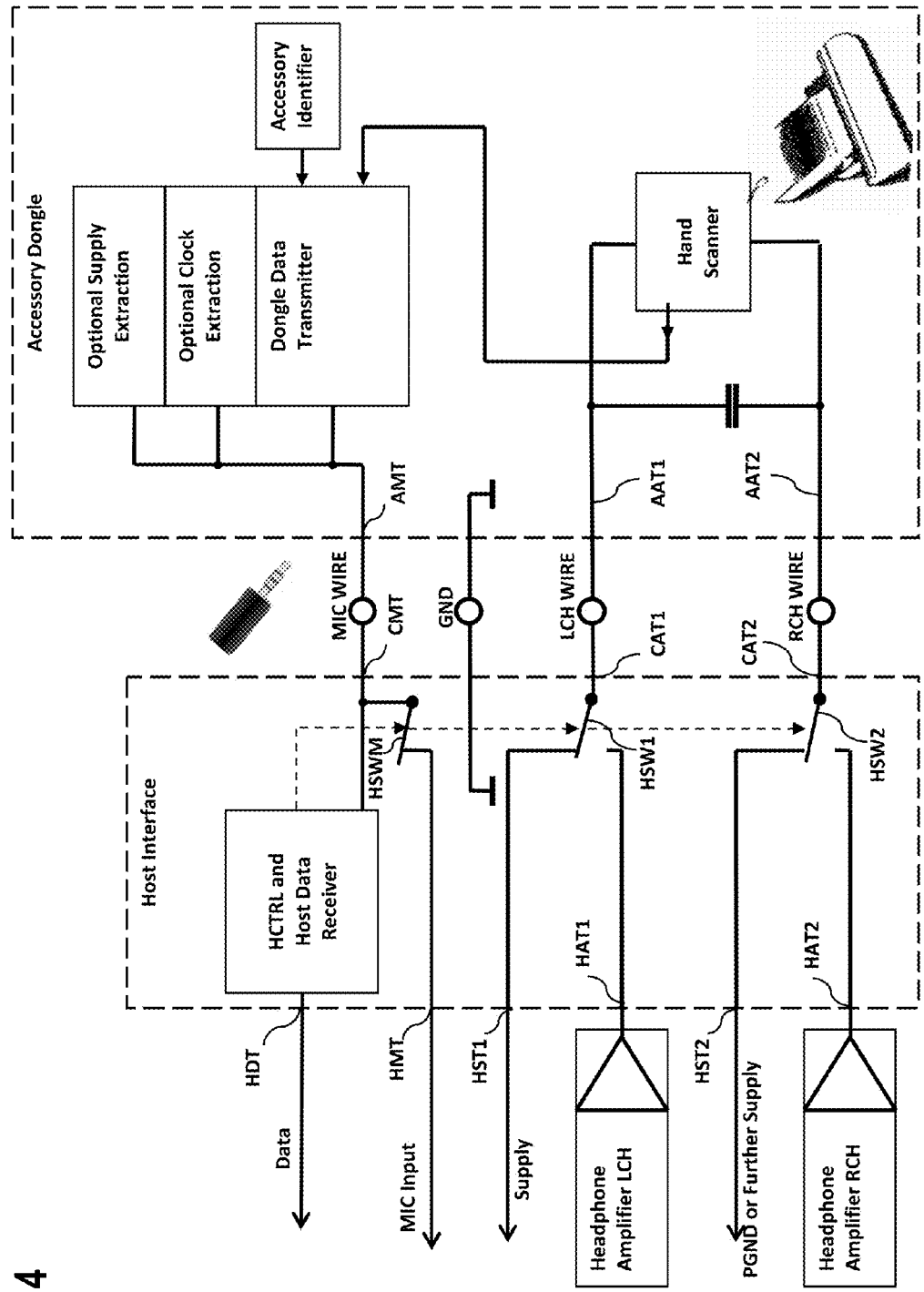
FIG. 4 shows a further example application of an arrangement according to FIG. 2.

FIG. 4 shows a further example application of the configuration shown in FIG. 2. In this example, the accessory load comprises a hand scanner for optical scanning. Such a scanner needs to illuminate the scan area. This may need a high supply current, which is provided over the host interface as described above. The scanned data can be sent to the host interface via the dongle data transmitter, as described above.

The example applications of FIG. 3 and FIG. 4 have the advantage that no separate power supply, for example in the form of batteries or the like, is needed in the accessory. Instead, the supply can be provided by the host interface, respectively the media device comprising the host interface.

Figure 5:
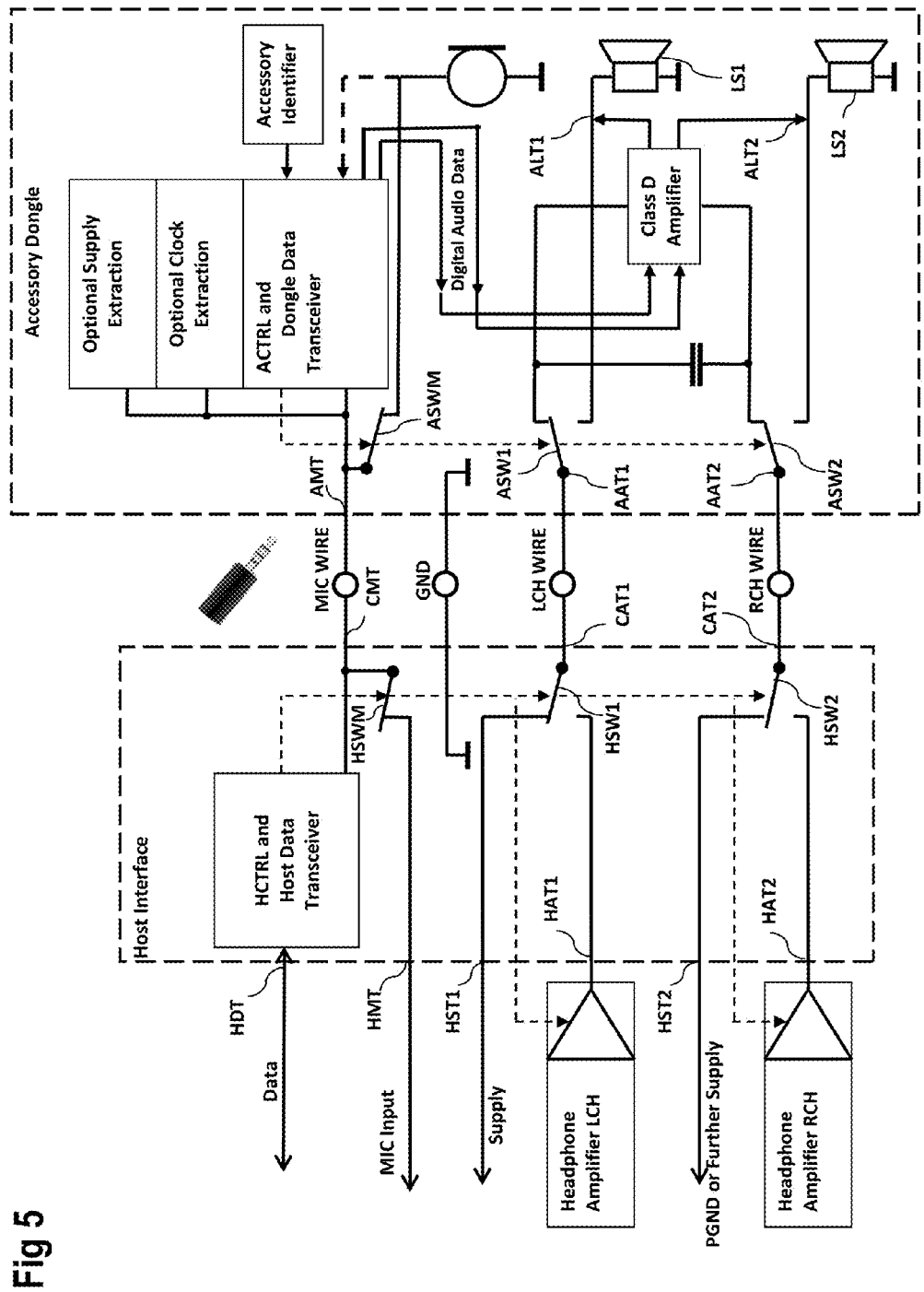
FIG. 5 shows an embodiment of a host interface in conjunction with an accessory interface for a headphone.

FIG. 5 shows a further example implementation, respectively application, of the improved interface concept that is based on the embodiments shown in FIG. 1 and FIG. 2. In this application the accessory interface is designed for a headphone or hands-free kit. To this end, besides the features described above for FIG. 1 and FIG. 2, the accessory interface comprises an accessory data receiver adapted to receive an encoded digital audio signal from the accessory microcontroller terminal AMT, the accessory data receiver being configured for producing digital audio data for a class-D amplifier from the encoded digital audio signal. The encoded digital audio signal may be transmitted according to the I2S standard.

The class-D amplifier may be included in the accessory interface or within the headphone or hands-free kit. The accessory interface comprises a first and a second accessory loudspeaker terminal ALT1, ALT2, which are coupled to the first and the second accessory audio terminal AAT1, AAT2. Respective loudspeakers LS1, LS2 can be connected to the first and the second accessory loudspeaker terminal ALT1, ALT2. The loudspeakers LS1, LS2 usually are not part of the accessory interface.

The class-D amplifier comprises supply inputs that are also coupled to the first and the second accessory audio terminal AAT1, AAT2. Compared to the applications shown in the previous figures, the class-D amplifier represents the accessory load that can use the supply provided by host interface.

With this configuration, the accessory interface of FIG. 5 can be operated in two basic modes of operation. In the first mode of operation analog audio signals are passed from the accessory audio terminals AAT1, AAT2 to the accessory loudspeaker terminals ALT1, ALT2 directly, as in a conventional headphone. In the second mode of operation, the digital audio data are used by the class-D amplifier for producing respective loudspeaker signals which are then provided to the accessory loudspeaker terminals ALT1, ALT2. In this second mode of operation, the supply signals provided at the accessory audio terminals AAT1, AAT2 are used as supply for the class-D amplifier. To this end, the accessory control circuit controls respective accessory switches ASW1, ASW2 to assume the respective switching state associated with the mode of operation.

In order to determine the respective mode of operation, the accessory control circuit is adapted to detect whether a media device with a host interface is connected that is able to provide at least one supply signal and an encoded digital audio signal. If such a host interface is detected, the class-D amplifier is operated as described above. Otherwise, the accessory loudspeaker terminals ALT1, ALT2 are provided with the analog audio signals provided by an e.g. conventional media device.

The detection of which kind of host interface or media device is connected to the accessory interface may be based on a host identification signal provided by the host interface, as described above. For example, such detection may also be based on an identification handshake process started after plug-in of the accessory.

The accessory interface may optionally further include a terminal for connecting one or more microphones, providing analog or digital microphone signals. For example, such a microphone may be used as a speech microphone for a hands-free kit. However, the one or more microphones may also be microphones for recording noise signals, in particular ambient noise signals, which can be used for an active noise cancelling, ANC, algorithm. Depending on the type of signal, namely analog or digital microphone signal, the accessory control circuit may affect an accessory microphone switch ASWM to directly connect the analog microphone to the accessory microphone terminal AMT, or to connect the accessory microphone terminal AMT to the dongle data transceiver. In the latter case, the one or more digital microphone signals are encoded by the dongle data transceiver and transmitted over the MIC WIRE to the host data transceiver, which receives the encoded microphone signals and provides a decoded representation thereof to the host data terminal HDT for processing by the media device.

In some implementations, the one or more microphones may directly provide digital microphone signals to the dongle data transceiver, which does the encoding or a signal multiplexing for transmission over the single MIC WIRE. In other implementations, one or more analog microphone signals may be received by the dongle data transceiver and converted into the digital domain before transmittal to the host data transceiver.

Accordingly, in some applications, an ANC headset may be implemented which transmits digital microphone data to a media device over the MIC WIRE and receives digital audio data over the MIC WIRE at the same time. For example, this effects that there is no need to convert a digital audio data to the analog domain for the whole ANC loop.

In particular, in such an application, digital bit streams are sent down from the headset to the host device, respectively media device. Digital signal processing may be done on these bit streams to get ANC subtraction signals in the media device. Those ANC subtraction signals get added to the digital playback audio data. The digital audio signal of the sum of playback and ANC signal gets streamed up to the headset. In the headset, the digital audio signals for the left and right channels are directly fed to the class-D inputs. In other implementations, the ANC processing may also be performed in the headset, but directly on the digital audio signal received at the dongle data receiver. It is apparent for the skilled reader that the block depicting the class-D amplifier represents a dual channel amplifier outputting amplified signals for the two loudspeakers LS1, LS2.

The invention claimed is:

1. A host interface for a media device, the host interface comprising:
   a first host audio terminal for receiving a first analog audio signal;
   a second host audio terminal for receiving a second analog audio signal;
   a first connector audio terminal for connecting a first pole of a four-pole connector;
   a second connector audio terminal for connecting a second pole of the four-pole connector;
   a connector microphone terminal for connecting a third pole of the four-pole connector, the host interface being configured to send clock information and power over the connector microphone terminal and the connected third pole of the four-pole connector;
   a data transmitter that is configured to send an encoded digital audio signal to the connector microphone terminal over the connected third pole of the four-pole connector; and
   a host control circuit that is adapted
      to detect whether a device is connected that requires a supply signal over the four-pole connector and further requires a further supply signal over the four-pole connector,
      if no connection of the device requiring the supply signal and/or the further supply signal is detected, to pass the received first analog audio signal to the first pole of the four-pole connector by connecting the first connector audio terminal to the first host audio terminal and to pass the received second analog audio signal to the second pole of the four-pole connector by connecting the second connector audio terminal to the second host audio terminal, and
      if the connection of the device requiring the supply signal and the further supply signal is detected, to connect the first pole of the four-pole connector to a supply terminal by connecting the first connector audio terminal to the supply terminal and to connect the second pole of the four-pole connector to a further supply terminal by connecting the second connector audio terminal to the further supply terminal.

2. The host interface according to claim 1, wherein the supply terminal is operable to be connected to one of the following:
   a supply rail of the host interface;
   a voltage regulator of the host interface;
   a current regulator of the host interface;
   a supply rail of the media device comprising the host interface;
   a voltage regulator of the media device comprising the host interface;
   a current regulator of the media device comprising the host interface.

3. The host interface according to claim 1, wherein the host control circuit is adapted, if the device requiring the supply signal and the further supply signal is detected, to generate a deactivation signal for deactivating respective audio amplifiers providing the first and the second analog audio signals.

4. The host interface according to claim 1, wherein the host control circuit is adapted, if the device requiring the supply signal and the further supply signal is detected, to electrically disconnect the first connector audio terminal from the first host audio terminal and the second connector audio terminal from the second host audio terminal.

5. The host interface according to claim 1, wherein the host control circuit is adapted to detect whether the device requiring the supply signal and the further supply signal is connected based on an identification signal received at the connector microphone terminal.

6. The host interface according to claim 1, further comprising:
   a host microphone terminal; and
   a data receiver;
   wherein the host control circuit is adapted
      to detect whether a device is connected that transmits encoded data over the connector microphone terminal,
      if the connection of the device transmitting encoded data is detected, to connect the connector microphone terminal to the data receiver for decoding received encoded data, and
      if no connection of the device transmitting encoded data is detected, to connect the connector microphone terminal to the host microphone terminal.

7. The host interface according to claim 1, being configured to further transmit a host identification signal over the connector microphone terminal.

8. The host interface according to claim 1, further comprising:
   a common ground terminal for connecting a fourth pole of the four-pole connector,
   wherein the further supply terminal is formed by a power ground terminal that is separated from the common ground terminal.

9. An accessory interface for a headphone or a hands-free kit, the accessory interface comprising:
   a first accessory audio terminal for connecting a first pole of a four-pole connector;
   a second accessory audio terminal for connecting a second pole of the four-pole connector;
   an accessory microphone terminal for connecting a third pole of the four-pole connector, the accessory interface being configured to receive clock information and power from a connector microphone terminal that is connected to the third pole of the four-pole connector;
   a first accessory loudspeaker terminal for connecting a first loudspeaker;

a second accessory loudspeaker terminal for connecting a second loudspeaker;
a class-D amplifier with a first amplifier output and a second amplifier output;
an accessory data receiver adapted to receive an encoded digital audio signal from the third pole of the four-pole connector over the accessory microphone terminal for producing digital audio data for the class-D amplifier; and
an accessory control circuit that is adapted
to detect whether a media device with a host interface according to claim 1 is connected at the four-pole connector,
if no connection of the media device with the host interface is detected, to connect the first accessory audio terminal to the first accessory loudspeaker terminal and the second accessory audio terminal to the second accessory loudspeaker terminal, and
if such media device is detected, to connect supply inputs of the class-D amplifier to the first and the second accessory audio terminal, to pass the digital audio data to the class-D amplifier, and to connect the first amplifier output to the first accessory loudspeaker terminal and the second amplifier output to the second accessory loudspeaker terminal.

10. The accessory interface according to claim 9, further comprising:
a supply extraction which is configured to generate a supply voltage or a supply current for the accessory interface from a signal at the accessory microphone terminal connected to the connector microphone terminal, the signal containing the received power.

11. The accessory interface according to claim 9, further comprising:
a clock extraction which is configured to generate a clock signal for the accessory interface from a signal at the accessory microphone terminal connected to the connector microphone terminal, the signal containing the received clock information.

12. The accessory interface according to claim 9, further comprising:
an accessory data transmitter adapted to receive a microphone signal from a microphone of the headphone or the hands-free kit and to produce an encoded digital microphone signal thereof,
wherein the accessory control circuit is adapted
to detect whether a media device is connected that is operable to process an encoded digital microphone signal,
if the connection of the media device being operable to process an encoded digital microphone signal is detected, to send the encoded digital microphone signal to the accessory microphone terminal, and
if no connection of the media device being operable to process an encoded digital microphone signal is detected, to send an analog microphone signal to the accessory microphone terminal.

13. A method for managing a connection between a host interface for a media device and an accessory device, the method comprising:
physically connecting the host interface and the accessory device using a four-pole connector;
in the host interface, detecting whether an accessory device is connected that requires a supply signal over the four-pole connector and further requires a further supply signal over the four-pole connector;
if no connection of the accessory device requiring the supply signal and/or the further supply signal is detected, the host interface passing a first analog audio signal to a first pole of the four-pole connector and passing a second analog audio signal to a second pole of the four-pole connector;
if the connection of the accessory device requiring the supply signal and the further supply signal is detected, the host interface
connecting the first pole to a supply terminal and connecting the second pole to a further supply terminal;
sending clock information and power over a third pole of the four-pole connector to the accessory device; and
sending an encoded digital audio signal over the third pole of the four-pole connector to the accessory device.

14. The method according to claim 13, wherein the detection, whether the accessory device requiring the supply signal and the further supply signal is connected, is based on an identification signal received at the third pole of the four-pole connector.

15. The method according to claim 13, further comprising:
in the host interface, detecting whether an accessory device is connected that transmits encoded data over the third pole of the four-pole connector;
if connection of the accessory device transmitting encoded data is detected, the host interface passing received encoded data to a data receiver of the host interface for decoding the received encoded data; and
if no connection of the device transmitting encoded data is detected, the host interface connecting the third pole to a host microphone terminal of the host interface.

16. The method according to claim 13, further comprising:
in the accessory device, producing digital audio data for a class-D amplifier included in the accessory device based on the encoded digital audio signal.

17. The method according to claim 13, wherein a common ground terminal is connected to a fourth pole of the four-pole connector, and wherein the further supply terminal is formed by a power ground terminal that is separated from the common ground terminal.

\* \* \* \* \*